United States Patent
Miguel Sánchez

(10) Patent No.: US 11,614,227 B2
(45) Date of Patent: Mar. 28, 2023

(54) SAFETY INTERLOCK SYSTEM FOR ILLUMINATION SYSTEMS

(71) Applicant: ams Sensors Singapore Pte. Ltd., Singapore (SG)

(72) Inventor: Javier Miguel Sánchez, Zurich (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/433,511

(22) PCT Filed: Mar. 25, 2020

(86) PCT No.: PCT/SG2020/050161
§ 371 (c)(1),
(2) Date: Aug. 24, 2021

(87) PCT Pub. No.: WO2020/197496
PCT Pub. Date: Oct. 1, 2020

(65) Prior Publication Data
US 2022/0146084 A1    May 12, 2022

Related U.S. Application Data

(60) Provisional application No. 62/824,421, filed on Mar. 27, 2019.

(51) Int. Cl.
*F21V 25/02* (2006.01)
*H01S 5/00* (2006.01)
(Continued)

(52) U.S. Cl.
CPC .......... *F21V 25/02* (2013.01); *H01S 5/06825* (2013.01); *H05B 45/12* (2020.01); *F21Y 2115/30* (2016.08); *H01S 5/005* (2013.01)

(58) Field of Classification Search
CPC ........ F21V 25/02; G01N 27/20; G01N 27/24; H01S 5/06825; H01S 5/05
See application file for complete search history.

(56) References Cited

U.S. PATENT DOCUMENTS

| | | |
|---|---|---|
| 2015/0380899 A1 | 12/2015 | Krijn et al. |
| 2016/0290856 A1 | 10/2016 | Fiederling et al. |
| 2018/0180238 A1 | 6/2018 | Haas et al. |

FOREIGN PATENT DOCUMENTS

| | | | | |
|---|---|---|---|---|
| CN | 107608167 A | | 1/2018 | |
| CN | 107991836 A | * | 5/2018 | ............. G03B 21/14 |

(Continued)

OTHER PUBLICATIONS

English machine translation CN 107608167A retrieved from Espacenet (Year: 2018).*

(Continued)

*Primary Examiner* — Mariceli Santiago
(74) *Attorney, Agent, or Firm* — Viering, Jentschura & Partner MBB

(57) ABSTRACT

An illumination system (200) includes an illumination device (202); an optical element (206) positioned to receive light (208) from the illumination device (202); a layer (210) of a transparent material disposed on the optical element (206) and positioned to receive light (208) from the illumination device (202); and an interlock circuit (220) configured to measure a resistivity of the layer (210) of transparent material and to control operation of the illumination device (202) based on the measured resistivity.

18 Claims, 7 Drawing Sheets

(51) Int. Cl.
    *F21Y 115/30*     (2016.01)
    *H05B 45/12*     (2020.01)
    *H01S 5/068*     (2006.01)

(56) References Cited

FOREIGN PATENT DOCUMENTS

| | | | | |
|---|---|---|---|---|
| CN | 108121133 A | * | 6/2018 | ............ G03B 21/00 |
| CN | 207557634 U | * | 6/2018 | |
| CN | 108646326 A | | 10/2018 | |
| CN | 109061879 A | | 12/2018 | |
| TW | 202017270 A | * | 5/2020 | |

OTHER PUBLICATIONS

English machine translation CN 107991836A retrieved from Espacenet (Year: 2018).*
English machine translation CN 208044211U retrieved from Espacenet (Year: 2018).*
International Search Report and Written Opinion for application No. PCT/SG2020/050161 dated Jun. 12, 2020 (19 pages).

* cited by examiner

SAFETY INTERLOCK SYSTEM FOR ILLUMINATION SYSTEMS

BACKGROUND

Three-dimensional (3-D) sensing can be used for a wide range of applications, including for facial recognition. 3-D sensing systems can include high powered illumination devices, such as lasers.

SUMMARY

In an aspect, an illumination system includes an illumination device; an optical element positioned to receive light from the illumination device; a layer of a transparent material disposed on the optical element and positioned to receive light from the illumination device; and an interlock circuit configured to measure a resistivity of the layer of transparent material and to control operation of the illumination device based on the measured resistivity.

Embodiments can include one or more of the following features.

The layer of transparent material comprises a material having a non-zero absorption at a wavelength of the light from the illumination device.

The layer of transparent material comprises a film of the transparent material disposed on a surface of the optical element.

The interlock circuit is configured to shut off the illumination device when the measured resistivity does not satisfy a safety criterion.

The interlock circuit is configured to measure the resistivity of the layer of transparent material synchronously with a modulation frequency of the illumination device. The interlock circuit is configured to implement lock-in demodulation. The interlock circuit is configured to shut off the illumination device when the measured resistivity is not synchronous with the modulation frequency of the illumination device.

The layer of transparent material has a lateral extent sufficient to encompass an entire field of illumination of the illumination device. The layer of transparent material has a substantially uniform thickness across the entire field of illumination of the illumination device.

The illumination system includes a reference layer of the transparent material positioned to not receive light from the illumination device; and a reference circuit configured to measure a resistivity of the reference layer of the transparent material.

The transparent material comprises a conductive material or a doped semiconductor material.

The layer of conductive material comprises indium tin oxide (ITO).

The illumination device comprises a laser, e.g., a vertical cavity surface emitting laser (VCSEL).

The optical element comprises a lens.

The optical element comprises a diffuser.

In an aspect, a mobile communications device includes an illumination system including any one or more of the foregoing features.

In an aspect, a method includes operating an illumination device to illuminate an optical element, including illuminating a layer of a transparent material disposed on the optical element; measuring a resistivity of the layer of transparent material by an interlock circuit; and controlling operation of the illumination device based on the measured resistivity of the layer of transparent material.

Embodiments can include one or more of the following features.

Controlling operation of the illumination device comprises shutting off the illumination device when the measured resistivity does not satisfy a safety criterion. Controlling operation of the illumination device comprises shutting off the illumination device when the measured resistivity falls outside of an allowable range of values.

Measuring a resistivity of the layer of transparent material comprises measuring the resistivity of the layer of transparent material synchronously with a modulation frequency of the illumination device. Measuring the resistivity of the layer of transparent material synchronously with a modulation frequency of the illumination device comprises implementing a lock-in demodulation. Controlling operation of the illumination device comprises shutting off the illumination device when the measured resistivity is not synchronous with the modulation frequency of the illumination device.

The method includes measuring a resistivity of a reference layer of the transparent material, the reference layer not being illuminated by the illumination device. The method includes controlling operation of the illumination device based on a comparison between the measured resistivity of the layer of transparent material and the measured resistivity of the reference layer. The method includes controlling operation of the illumination device based on the measured resistivity of either the layer of transparent material or the reference layer not satisfying a safety criterion.

The approaches described here can have one or more of the following advantages. The illumination systems have an interlock capability that can mitigate risk of eye damage in users of the system. The interlock circuits described here are robust to noise and have a high sensitivity to AC and DC signals, enabling safety monitoring of both modulated illumination sources and the structural integrity of optical elements of the illumination systems. The interlock circuits rely on sensing layers that cover the full field of illumination. These layers have minimal optical impact and can be generally straightforward and inexpensive to fabricate.

The details of one or more implementations are set forth in the accompanying drawings and the description below. Other features and advantages will be apparent from the description and drawings, and from the claims.

DETAILED DESCRIPTION

We describe here interlock systems for illumination systems, such as illumination systems for 3-D sensing applications or augmented reality systems. The interlock systems are able to detect indicators of malfunction or structural damage in the illumination systems and shut off illumination devices responsive to such detection, mitigating the risk of eye damage that could otherwise arise from such malfunction or structural damage.

Figure 1:
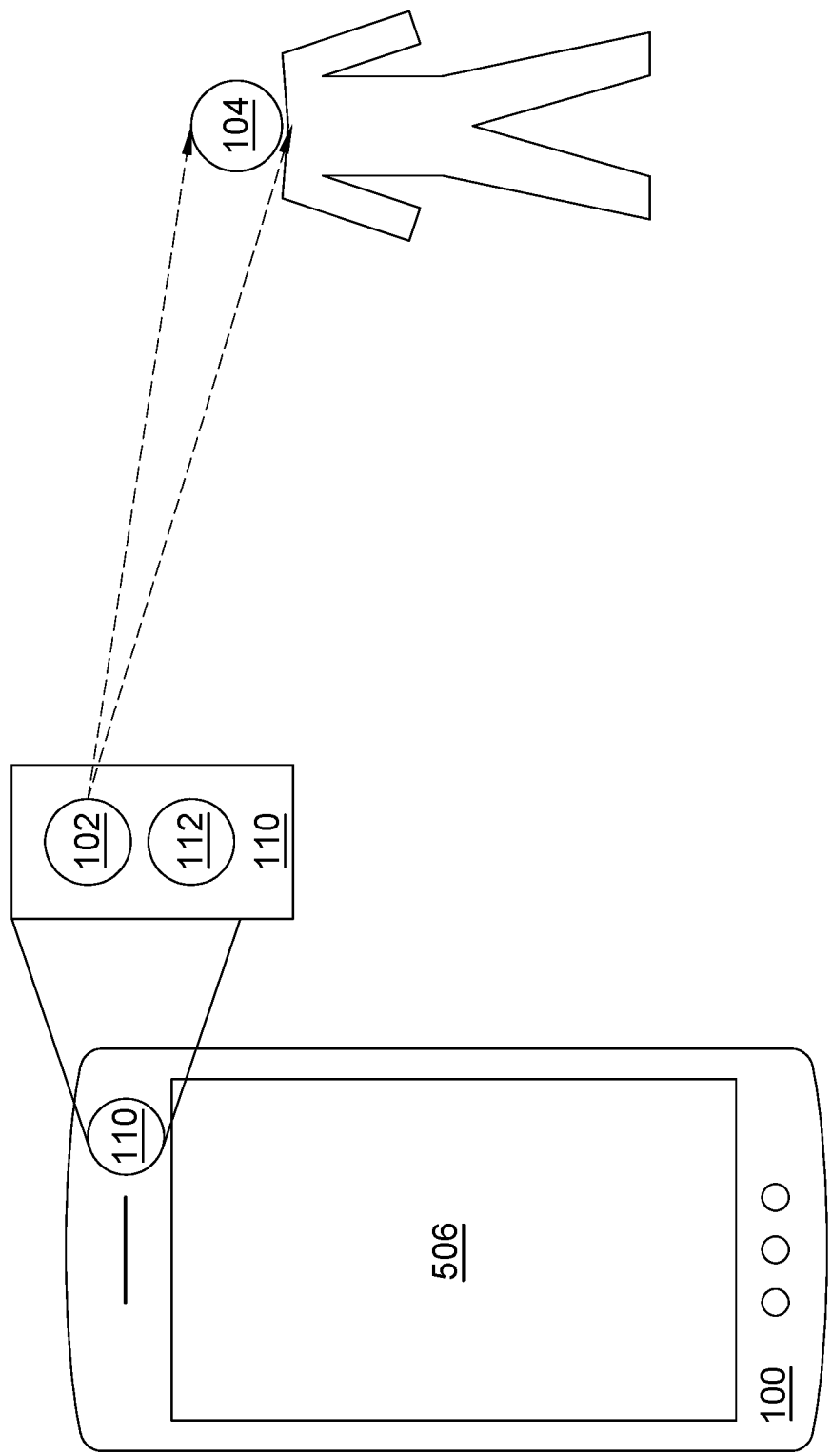
FIG. 1 is a diagram of a mobile device.

Referring to FIG. 1, a mobile device 100 can incorporate a 3-D sensing system 110, e.g., for facial recognition of a user 104 of the device. The 3-D sensing system 110 employs an illumination device 102, which can be a high powered illumination device such as a laser. In some cases, illuminating a face of a user 104 of the mobile device 100 with an illumination device 102 that emits high powered illumination, such as a laser beam, can present safety hazards, e.g., to the user's eyes. For instance, a malfunction of the illumination device or a structural defect in a module enclosing the illumination device, e.g., an optical element such as a diffuser, can cause the illumination device to present safety hazards.

To mitigate the risk of damage, such as eye damage, the 3-D sensing system 110 incorporates an interlock system 112. The interlock system 112 can sense, in real time, indicators of malfunction of the illumination device 102 and indicators of structural damage to optical elements in the path of the illumination. Responsive to sensing such an indication, the interlock system 112 can shut off the illumination device 102, reducing the potential for eye damage resulting from malfunction or damage to the illumination device 102 or its associated optical elements.

In the example of FIG. 1, the illumination device 102 is a front-facing illumination device that illuminates in the direction of the front of the mobile device 100 (e.g., the side having a display screen 106). In some examples, the illumination device can be a world-facing illumination device that illuminates in the direction of the back of the mobile device 100 (e.g., the side opposite the front).

Figure 2A:
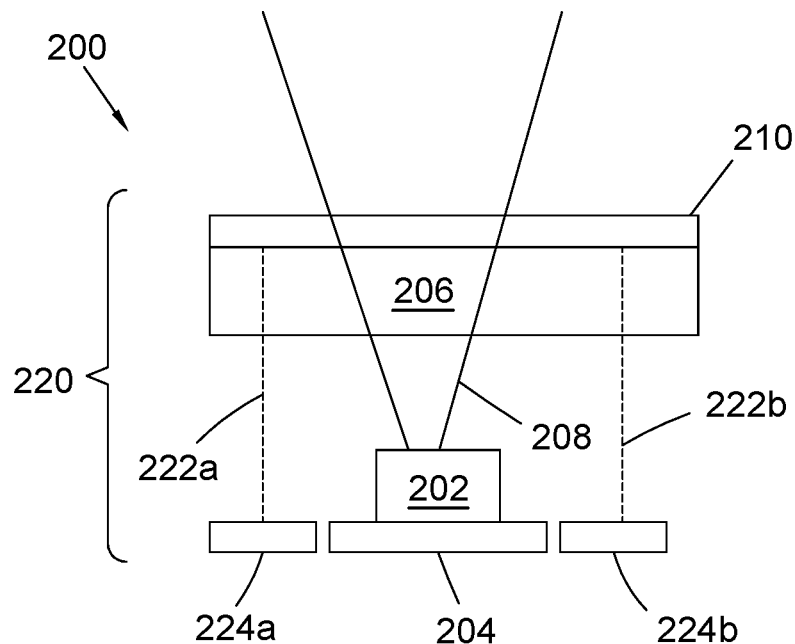
FIGS. 2A and 2B are diagrams of an illumination system.

Referring to FIG. 2A, an example illumination system 200 includes an illumination device 202, such as a laser diode, vertical cavity surface emitting laser (VSCEL), another type of laser, or another type of illumination device. In the example of FIG. 2, the illumination device 202 is disposed on a substrate 204, such as a printed circuit board substrate. In some examples, the illumination device 202 can be integrated into the substrate, e.g., an integrated circuit substrate. The illumination device 202 can be a modulated illumination device that emits light at a modulation frequency, e.g., for three-dimensional imaging applications such as time-of-flight imaging.

Figure 2B:
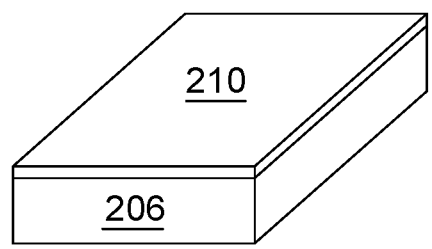

The illumination system 200 includes an optical element 206 that is positioned to receive light from the illumination device 202, e.g., positioned in the path of a light beam 208 emitted by the illumination device 202. The optical element 206 can be, e.g., a lens, a diffractive element, or another type of optical element. A sensing layer 210 is disposed on the optical element 206 and positioned to receive light from the illumination device 202, e.g., positioned in the path of the light beam 208. Referring also to FIG. 2B, the sensing layer 210 is a continuous, unpatterned film formed on the surface of the optical element 206. The lateral extent of the sensing layer 210 is sufficient to encompass, partially or entirely, the region of the optical element 206 that falls within the path of the light beam 208 (we sometimes refer to this region as the field of illumination). The sensing layer 210 can have a substantially uniform thickness across the entire field of illumination, e.g., a thickness that varies by less than about 25%, less than about 20%, less than about 10%, less than about 5%, or less than about 1% across the field of illumination. By covering the full field of illumination, the optical impact of the layer 210 on the light beam 208 is minimal, e.g., the homogeneous thin film of the layer does not include patterning or shapes that provide horizontal changes in index of refraction that would introduce complexities into the path of the light beam. A homogeneous layer 210 is also generally straightforward to fabricate, e.g., without requiring patterning and lithographic processing.

The sensing layer 210 is a conductive material that is transparent to the wavelength of the light emitted by the illumination device 202, but has a small, but non-zero, absorption at that wavelength. By transparent at a given wavelength, we mean a material that transmits at least some light at that wavelength, e.g., more than 50% of light at that wavelength, e.g., more than 80%, more than 85%, more than 90% of light, more than 95%, more than 98%, or more than 99%. For instance, the sensing layer 210 can be a highly doped semiconductor, such as indium tin oxide (ITO). The absorption of ITO at energies below its band gap (around 4 eV) is close to, but not exactly, zero. Due to the small, but non-zero, absorption of the sensing layer 210, the resistivity of the sensing layer 210 will change when the sensing layer 210 is irradiated, e.g., with light from the illumination device 202.

Because the resistivity of the sensing layer 210 changes with illumination, the sensing layer 210 can be used as an indicator of the functionality of the illumination device 202. The resistivity of the sensing layer 210 when illuminated is referred to as the illuminated resistivity of the sensing layer; the resistivity when the sensing layer 210 is not illuminated is referred to as the non-illuminated resistivity. The illuminated resistivity of the sensing layer 210 can indicate a power of the illumination emitted by the illumination device 202. A frequency of the change in resistivity between illuminated and non-illuminated resistivity (e.g., an alternating (AC) signal) can indicate the modulation frequency of the illumination device 202. The resistivity of the sensing layer 210 failing to satisfy a safety criterion (described in more detail below), e.g., a safety criterion pertaining to a value or a frequency of the resistivity, can indicate a possible malfunction of the illumination device 202. To promote safety, e.g., to protect the eyes of a user of a device incorporating the illumination device 202, the illumination device 202 can be controlled based on the measured resistivity of the sensing layer 210. For instance, the illumination device 202 can be shut off when the measured resistivity of the sensing layer 210 does not satisfy a safety criterion.

An interlock circuit 220 of the illumination system 200 is configured to measure the resistivity of the sensing layer 210 and control the operation of the illumination device 202 based on the measured resistivity. The interlock circuit 220 can measure a change in the resistivity of the sensing layer 210 synchronously with the modulation frequency of the illumination device 202, e.g., using lock-in demodulation techniques. The interlock circuit 220 includes electrical connections 222a, 222b that electrically connect the sensing layer 210 to respective electrical contacts 224a, 224b on the substrate 204. The electrical contacts 224a, 224b are in turn connected to circuitry, e.g., on or in the substrate 204 or elsewhere, for performing the interlock function. For instance, the electrical contacts 224a, 224b can be pads formed on the surface of an integrated circuit.

The interlock circuit 220 is a safety circuit that can shut off the illumination device 202 when the measured resistivity of the sensing layer 210 does not satisfy a safety criterion. In some examples, the safety criterion can be a threshold resistivity, such that the measured resistivity does not satisfy the safety criterion when the measured resistivity exceeds the threshold or falls below the threshold. In some examples, the safety criterion can be a resistivity range, such that the measured resistivity does not satisfy the safety criterion when the measured resistivity falls outside of the resistivity range. In some examples, the safety criterion can be the synchronization of the resistivity with the modulation frequency of the illumination device 202, such that the measured resistivity does not satisfy the safety criterion when the changes in the measured resistivity are asynchronous with the modulation frequency of the illumination device 202.

By shutting off the illumination device 202 when the measured resistivity of the sensing layer 210 does not satisfy a safety criterion, potential safety hazards can be mitigated. For instance, if the measured resistivity is indicative of a malfunction of the illumination device 202, e.g., the emission of light at too high a power or the continuous emission of high power light, shutting off the illumination device 202 can prevent the possibility of that light harming the eyes of a user of a device incorporating the illumination system 200.

In addition to indicating functionality of the illumination device 202, the resistivity of the sensing layer 210 can also indicate the structural integrity of the optical element 206. For instance, if the optical element 206 cracks or breaks, the sensing layer 210 itself will crack or break, resulting in a change in the conductivity (and hence the resistivity) of the sensing layer. A crack or break in the optical element 206 can present an eye safety hazard. For instance, for an optical element 206 including a diffuser, a crack or break can allow direct, high powered light to escape from the illumination system 200. Such a malfunction can be detected as a constant change in the resistivity of the sensing layer 210 (e.g., a change in a direct (DC) signal). Shutting off the illumination device 202 when the measured resistivity fails to satisfy a safety criterion can, e.g., prevent the escape of direct light from the illumination system 200, thereby preventing the possibility of eye damage from that direct light.

The synchronous lock-in detection of the resistivity of the sensing layer 210 enables the resistivity signal to be read out at the modulation frequency of the illumination light. This synchronization makes the detection scheme generally robust to noise, e.g., due to the reduced bandwidth from the lock-in detection method. For instance, the illumination device 202 can be driven by large currents, such as currents up to 3 A, in very short pulses, e.g., at modulation frequencies of greater than 100 MHz. This environment can give rise to noise due to electromagnetic interference. By synchronization between the detection scheme and the illumination modulation, the effect of this noise can be reduced or eliminated, enabling high sensitivity measurements of both AC and DC resistivity signals.

In addition, the sensing layer 210 is sensitive only to the modulation frequency of the laser (that is, the wavelength of the illumination light), which is the signal that is to be detected to ensure eye safety.

In some examples, the resistivity of the sensing layer 210 can be monitored over time, e.g., to monitor drift or degradation of the illumination device 202. For instance, small changes in resistivity of the sensing layer 210 over time can accumulate into a large difference from an initial resistivity 210, which can indicate a developing drift, degradation, or malfunction of the illumination device 202.

Figure 3:
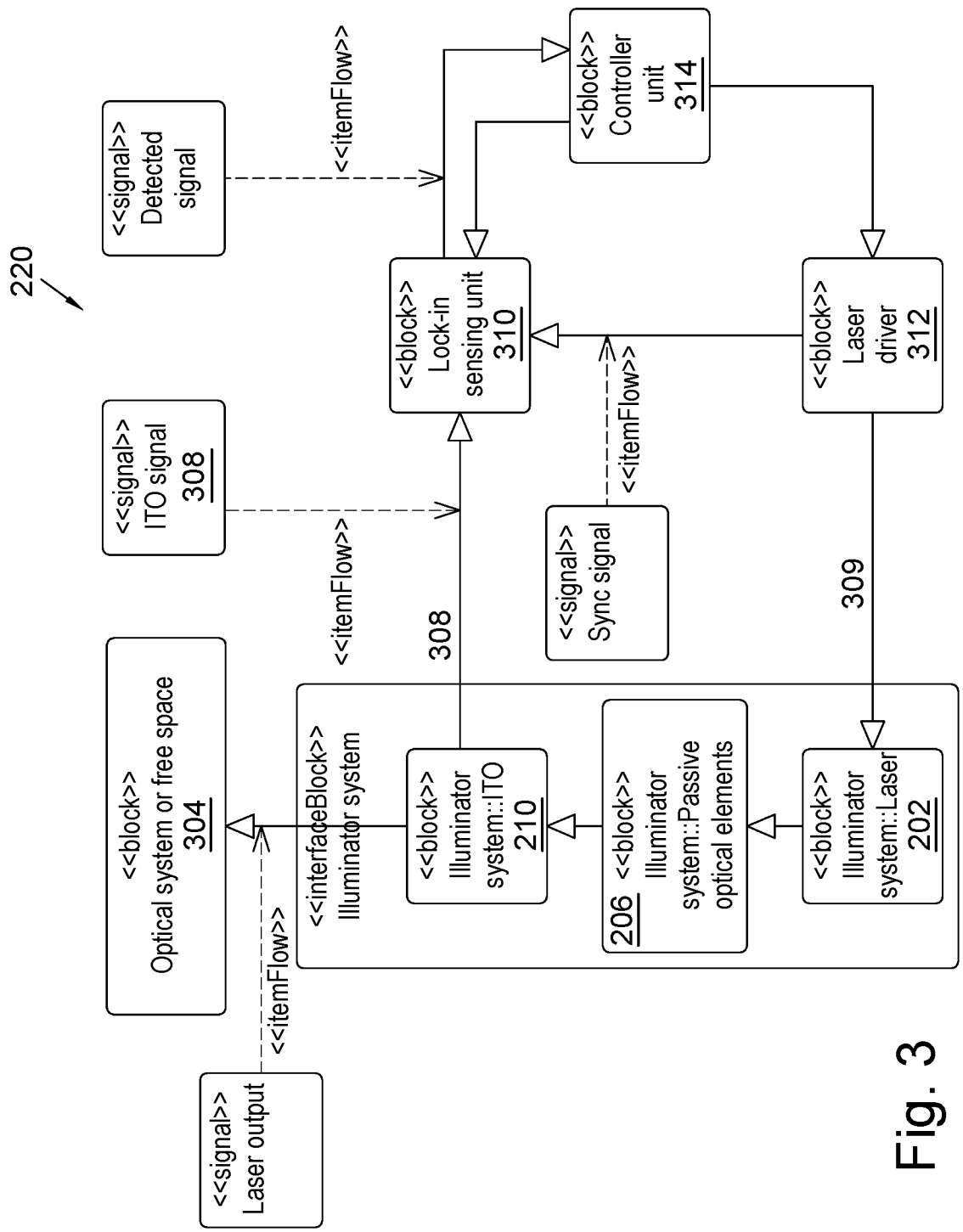
FIG. 3 is a block diagram of the illumination system of FIG. 2.

FIG. 3 is a block diagram of the operation of the illumination system 200. The illumination device 202 illuminates the passive optical element 206, such as a diffuser or lens, and the sensing layer 210 disposed on the optical element 206. Light 302 from the illumination device 202 that passes through the optical element 206 and sensing layer 210 illuminates a target 304, such as an optical system or free space, e.g., an exterior of a mobile device.

The interlock circuit 220 receives a signal 308 from the sensing layer 210, processes that signal 308, and provides a control signal 309 to the illumination device 202 based on the signal 308 from the sensing layer 210. As described here, the signal 308 is a resistivity of the sensing layer 210. In some examples, other properties of the sensing layer 210 can be used as the signal 308, such as a capacitance of the sensing layer 210 or a photosensitivity of the sensing layer 210.

The signal 308 from the sensing layer 210 is sensed by a lock-in sensing unit 310. For instance, the lock-in sensing unit 310 can monitor the signal 308 synchronously with the modulated operation of the illumination device 202 through an electrical connection between the lock-in sensing unit 310 and a laser driver 312. A controller unit 314 controls the operation of the lock-in sensing unit 310 and the laser driver 312 based on the detected signal 308 from the sensing layer 210. For instance, the controller unit 314 determines whether the signal 308 satisfies a safety criterion, and shuts off operation of the illumination device 202 if the safety criterion is not satisfied.

Figure 4:
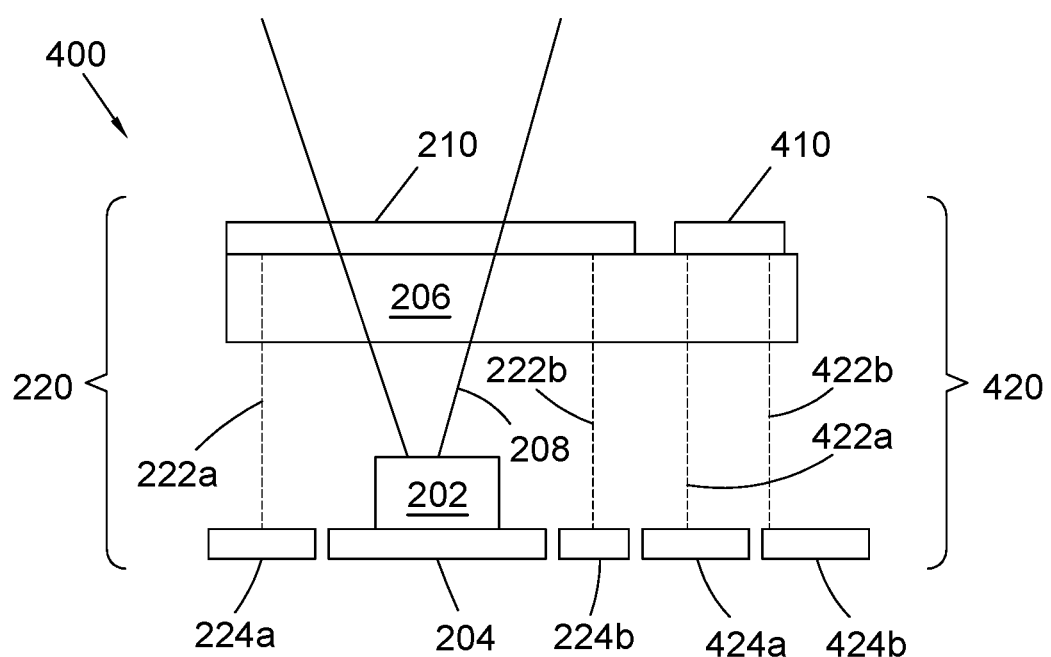
FIG. 4 is a diagram of an illumination system.

Referring to FIG. 4, an example illumination system 400 includes the sensing layer 210 and interlock circuit 220 of FIGS. 2A-2B and a reference circuit 420. The reference circuit 420 is configured to measure the resistivity of a reference layer 410 formed on the optical element 206. The reference layer 410 is a conductive material that is transparent to the wavelength of the light emitted by the illumination device 202, but has a small, but non-zero, absorption at that wavelength. For instance, the reference layer 410 can be a highly doped semiconductor, such as ITO. In some examples, the reference layer 410 is formed of the same material as the sensing layer 210.

The reference layer 410 is disposed on the optical element 206 such that the reference layer 410 is not in the path of the light beam 208, meaning that the reference layer 410 is not illuminated even when the illumination device 202 emits light.

The reference circuit 420 includes electrical connections 422a, 422b that electrically connect the reference layer 410 to respective electrical contacts 424a, 424b. The electrical contacts 424a, 424b can be on the same substrate 204 as the electrical contacts 224a, 224b of the interlock circuit 220 (as shown in FIG. 4) or can be formed on a different substrate. The electrical contacts 424a, 424b of the reference circuit 420 are connected to the interlock circuit 220.

The reference circuit 420 can help compensate for temperature drift in the illumination system 400. For instance, the temperature coefficient of the resistivity of ITO is about 2E-4 per ° C., which can lead to challenges in reading out the resistivity of the sensing layer 210 in the range of temperatures typical for consumer electronics, e.g., in the range of about −20° C. to about 80° C. The presence of the non-illuminated reference layer 410 on the same optical element 206 can help to account for temperature drift, e.g., by providing a stable, "dark" reference for the resistivity measurement. In addition, the reference circuit 420 introduces redundancy, e.g., for checking DC resistivity measurements. For instance, the resistivity of the reference circuit 420 can be an indicator of the structural integrity of the optical element 206.

Figure 5:
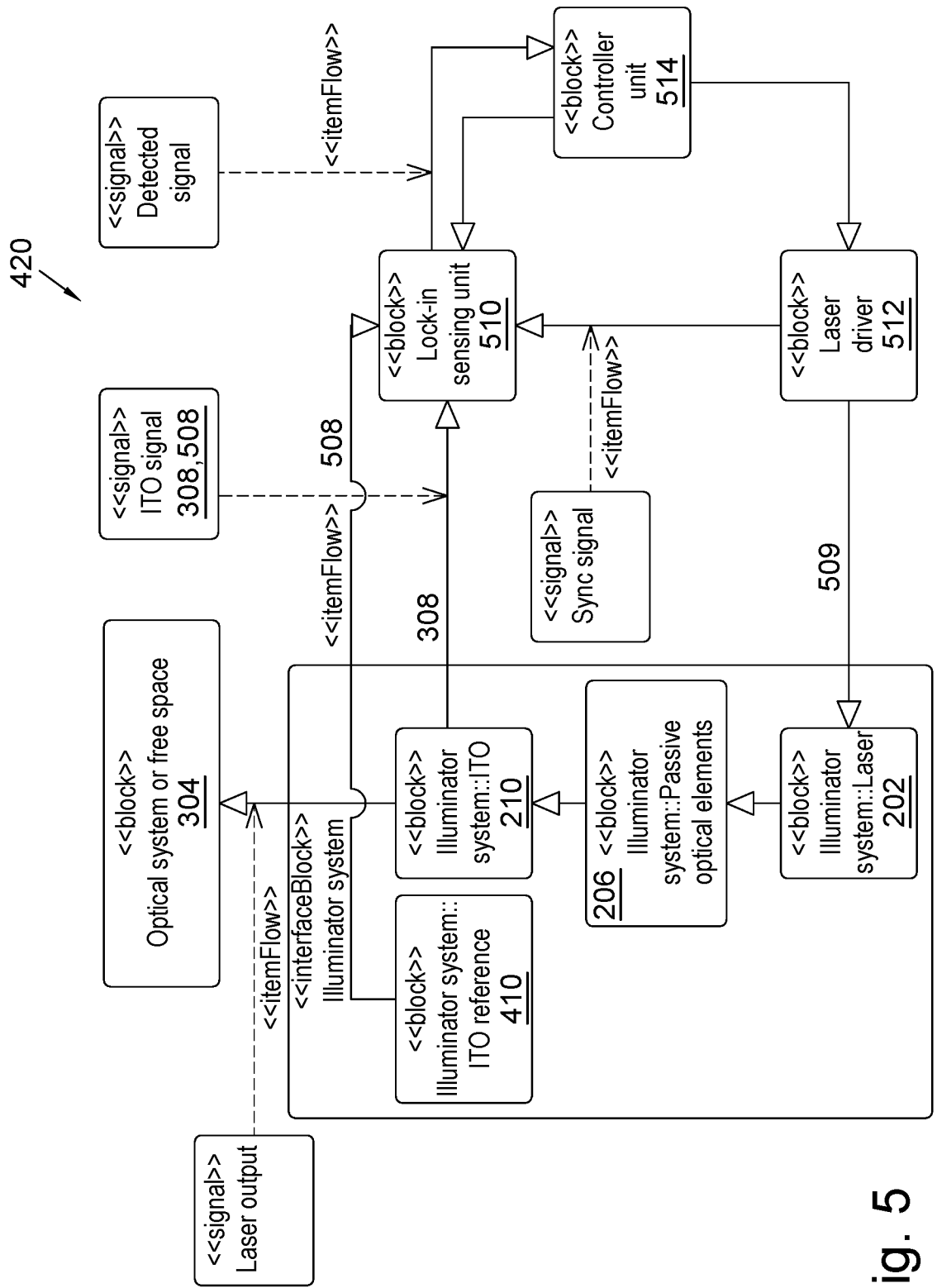
FIG. 5 is a block diagram of the illumination system of FIG. 4.

FIG. 5 is a block diagram of the operation of the illumination system 400. In the illumination system 400, the illumination device 202 illuminates the passive optical element 206 and the sensing layer 210 disposed on the optical element 206. However, the illumination device 202 does not illuminate the reference layer 410 that is also disposed on the optical element 206.

The interlock circuit 420 receives the signal 308 from the sensing layer 210 and a signal 508 from the reference layer 410, processes both signals 308, 508, and provides a control signal 509 to the illumination device 202 based on the signals 308, 508. As described here, the signals 308, 508 are the resistivity of the sensing layer 210 and the reference layer 410. In some examples, other properties of the sensing layer 210 and reference layer 410 can be used as the signals 308, 508, such as a capacitance or a photosensitivity of the sensing layer 210 and the reference layer 410.

The signals 308, 508 from the sensing layer 210 and reference layer 410 is sensed by a lock-in sensing unit 510. For instance, the lock-in sensing unit 510 can monitor at least the signal 308 from the sensing layer 210 synchronously with the modulated illumination of the illumination device 202 through an electrical connection between the lock-in sensing unit 510 and a laser driver 512. In some examples, the lock-in sensing unit 510 can also monitor the signal 508 from the reference layer 410 synchronously with the modulated illumination of the illumination device 202, e.g., to reduce bandwidth and enhance robustness to noise.

A controller unit 514 controls the operation of the lock-in sensing unit 510 and the laser driver 512 based on the detected signals 308, 508 from the sensing layer 210 and the reference layer 410. For instance, the controller unit 514 determines whether one or both of the signals 308, 508 satisfy a safety criterion, and shuts off operation of the illumination device 202 if the safety criterion is not satisfied. In some examples, the controller unit 514 controls operation of the illumination device 202 based on a synchronization between the signal 308 from the sensing layer 210 and the modulated illumination of the illumination device 202, e.g., where the safety criterion is a synchronization between the signal 308 and the modulation frequency of the illumination. In some examples, the controller unit 514 controls operation of the illumination device 202 based on a comparison between the signal 308 from the sensing layer 210 and the signal 508 from the reference layer 410, e.g., using the signal 508 from the reference layer 410 to reduce the effect of drift or noise on the signal 308 from the sensing layer 210. For instance, the controller unit 514 can control operation of the illumination device 202 based on the result of the comparison satisfying a safety criterion. In some examples, the controller unit 514 controls operation of the illumination device 202 based on either the signal 308 from the sensing layer 210 or the signal 508 from the reference layer 410 satisfying a safety criterion, e.g., using the reference layer 410 as a redundant sensing system.

Figure 6:
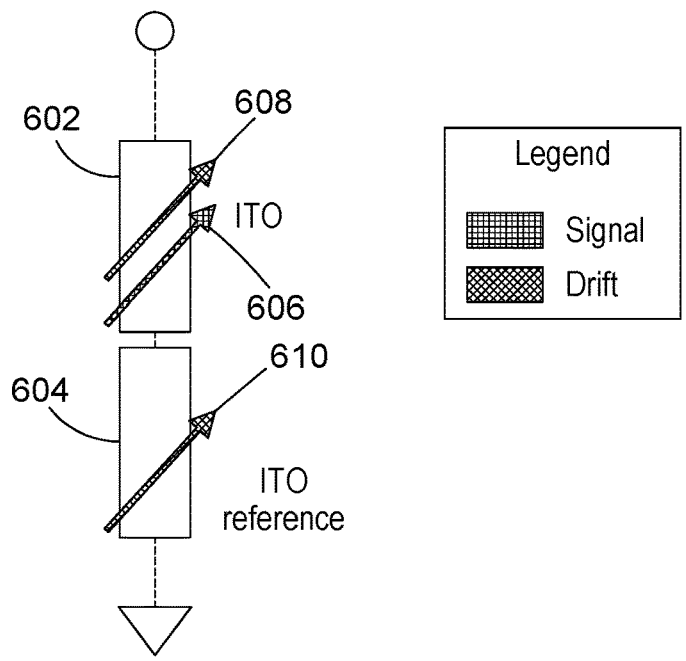
FIG. 6 is a circuit concept diagram of the illumination system of FIG. 4.

FIG. 6 is a circuit concept diagram of the illumination system 400, with the reference circuit 420 being used to provide a stable reference, e.g., to account for drift. With reference also to FIG. 4, the interlock circuit 220, including the sensing layer 210, is represented by a box 602. The reference circuit 420, including the reference layer 410, is represented by a box 604. A resistivity signal 606 is obtained from the interlock circuit 220. Drift occurs in both the interlock circuit 220 and the reference circuit 420, e.g., due to temperature fluctuations, aging, or other causes, and causes a variation in an impedance 608, 610 of both circuits 220, 420. Using the variation in the impedance 610 of the reference circuit 420 to remove the effect of the variation in the impedance 608 of the interlock circuit 220, the useful signal (the resistivity signal 606) can be isolated from noise and drift effects. For instance, the resistivity of the sensing layer 210 can be compared to the resistivity of the reference layer 410 to remove the effect of drift. The result of the comparison, e.g., the resistivity of the sensing layer 210 that is indicative of the performance of the illumination device 202, can be used in controlling the operation of the illumination device 202.

Figure 7:
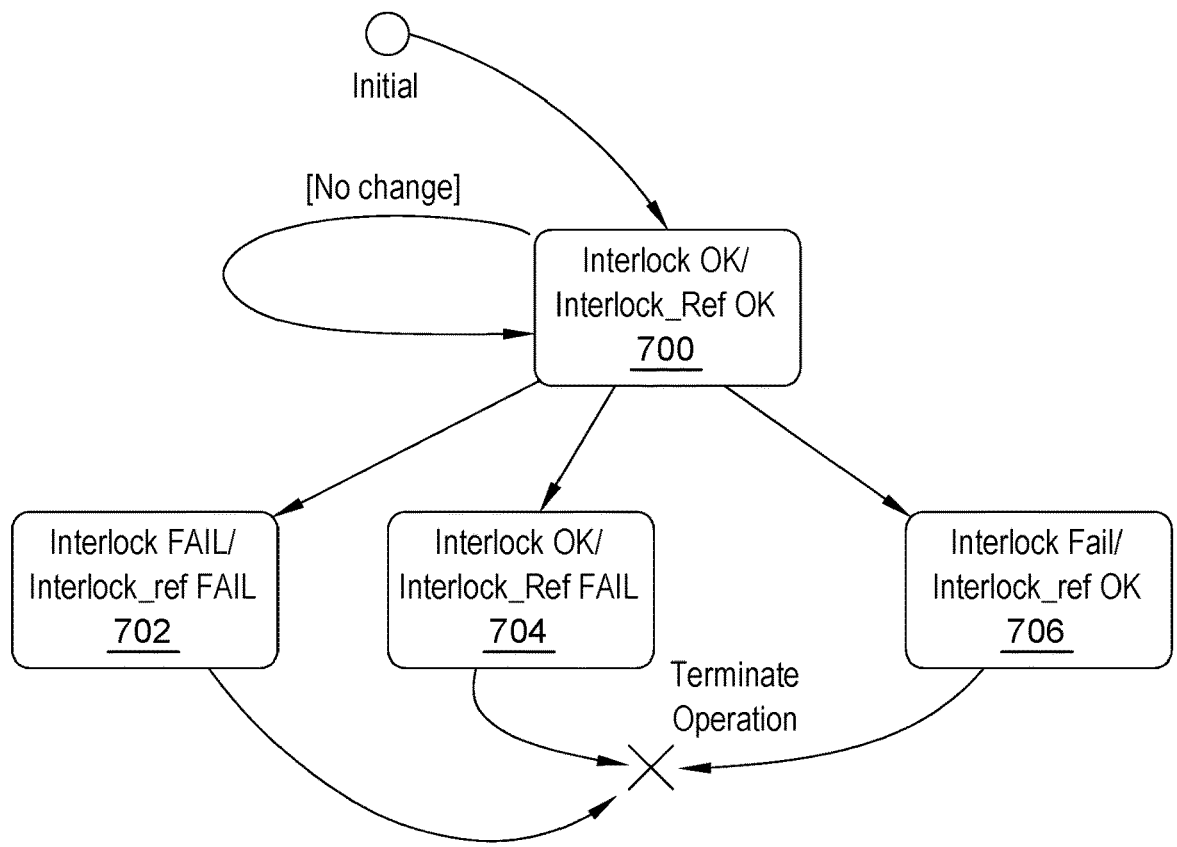
FIG. 7 is a state machine diagram of the illumination system of FIG. 4.

FIG. 7 is a state machine diagram illustrating the role of the reference circuit 420 as a redundant indicator of the structural integrity of the optical element 206. With reference also to FIG. 4, in a first state 700, both the DC resistivity of the sensing layer 210 as detected by the interlock circuit 220, and the DC resistivity of the reference layer 410 as detected by the reference circuit 420 satisfy a safety criterion, e.g., fall within a target range or satisfy a threshold value. In this first state 700, the resistivity of each of the sensing layer 210 and the reference layer 410 indicate that the optical element 206 is structurally sound, and no change is made to the operation of the illumination device 400.

In a second state 702, both the DC resistivity of the sensing layer 210 and the DC resistivity of the reference layer 410 fail to satisfy a safety criterion, e.g., fall outside of a target range or fail to satisfy a threshold value. In this second state 702, both resistivity values indicate the potential for a structural problem with the optical element 206, and the operation of the illumination device is terminated.

Third and fourth states 704, 706 illustrate the value of redundant sensing circuitry. In the third state 704, the DC resistivity of the sensing layer 210 fails to satisfy the safety criterion, while the DC resistivity of the reference layer 410 does satisfy the safety criterion. In the fourth state 706, the DC resistivity of the sensing layer 210 satisfies the safety criterion, while the DC resistivity of the reference layer 410 fails to satisfy the safety criterion. In both the third and fourth states 704, 706, redundancy dictates that one failure is sufficient to indicate the potential for a structural problem with the optical element 206, and the operation of the illumination device is terminated.

Figure 8:
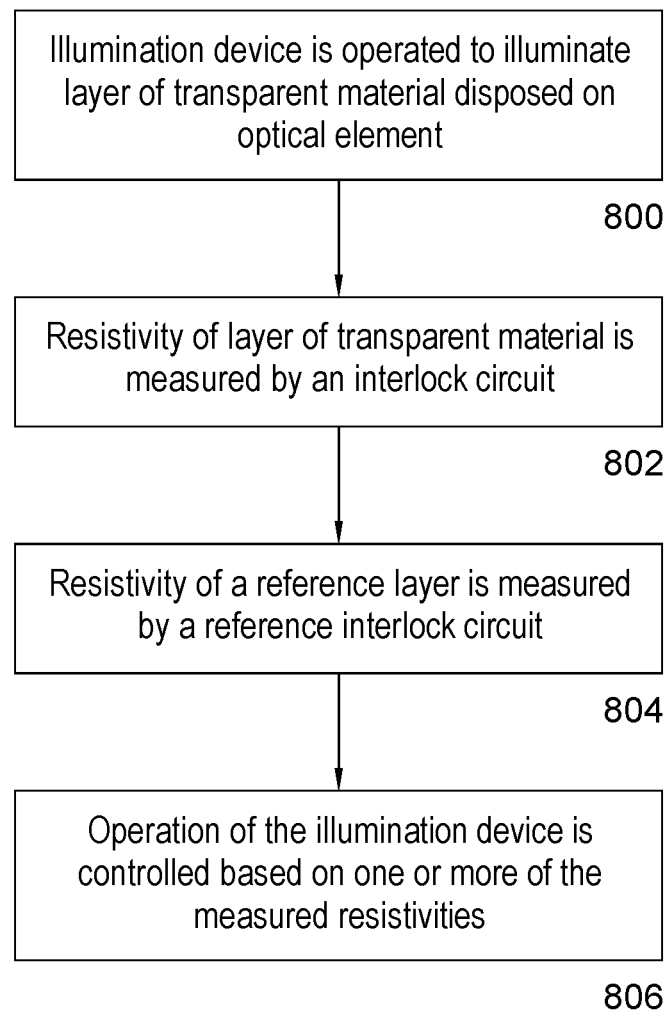
FIG. 8 is a flow chart.

FIG. 8 is a flow chart of a method for operating an illumination system. An illumination device is operated to illuminate a layer of transparent material disposed on an optical element (800). A resistivity of the layer of transparent material is measured by an interlock circuit (802), e.g., measured synchronously with a modulation frequency of the illumination device. For instance, the resistivity can be measured by implementing lock-in demodulation. In some examples, a resistivity of a reference layer of the transparent layer is also measured by a reference interlock circuit, where the reference layer is not illuminated by the illumination device (804).

Operation of the illumination device is controlled based on the measured resistivity of the layer of transparent material (806). In some examples, the illumination device can be shut off when the measured resistivity does not satisfy a safety criterion, e.g., when the measured resistivity falls outside of an allowable range of values or above or below a threshold value. In some examples, the illumination device can be shut off when the measured resistivity is not synchronous with the modulation frequency of the illumination device. In some examples, the operation of the illumination device can be controlled based on a comparison between the measured resistivity of the layer of transparent material and the measured resistivity of the reference layer.

The illumination systems described here can be implemented in mobile devices (e.g., as shown in FIG. 1), such as for front facing or world facing illuminators. For instance, the illumination systems described here can be incorporated into three dimensional sensing systems, such as time-of-flight, pattern, or stereo sensing systems, in mobile devices. The illumination systems described here can be incorporated into augmented reality systems, e.g., for applications such as gaming, industrial applications, educational applications, or automotive applications (e.g., driver monitoring). The illumination systems described here can be incorporated into other systems, such as time-of-flight or infrared imaging systems, e.g., automotive based systems, security systems, facial or gesture recognition systems, industrial control systems, robotic systems, farming systems, or various other types of systems. In general, the illumination systems described here can be incorporated into systems in which high powered, direct illumination is used, to enhance eye safety in such systems.

A number of embodiments have been described. Nevertheless, it will be understood that various modifications may be made without departing from the spirit and scope of the invention. For example, some of the steps described above may be order independent, and thus can be performed in an order different from that described.

Other implementations are also within the scope of the following claims.

The invention claimed is:

1. An illumination system comprising:
    an illumination device;
    an optical element positioned to receive light from the illumination device;
    a layer of a transparent material disposed on the optical element and positioned to receive light from the illumination device; and
    an interlock circuit configured to measure a resistivity of the layer of transparent material and to control operation of the illumination device based on the measured resistivity,
    wherein the interlock circuit is configured to measure the resistivity of the layer of transparent material synchronously with a modulation frequency of the illumination device.

2. The illumination system of claim 1, in which the layer of transparent material comprises a material having a non-zero absorption at a wavelength of the light from the illumination device.

3. The illumination system of claim 1, in which the layer of transparent material comprises a film of the transparent material disposed on a surface of the optical element.

4. The illumination system of claim 1, in which the interlock circuit is configured to shut off the illumination device when the measured resistivity does not satisfy a safety criterion.

5. The illumination system of claim 1, in which the interlock circuit is configured to implement lock-in demodulation.

6. The illumination system of claim 1, in which the interlock circuit is configured to shut off the illumination device when the measured resistivity is not synchronous with the modulation frequency of the illumination device.

7. The illumination system of preceding claim 1, in which the layer of transparent material has a lateral extent sufficient to encompass an entire field of illumination of the illumination device.

8. The illumination system of claim 7, in which the layer of transparent material has a substantially uniform thickness across the entire field of illumination of the illumination device.

9. The illumination system of claim 1, comprising:
    a reference layer of the transparent material positioned to not receive light from the illumination device; and
    a reference circuit configured to measure a resistivity of the reference layer of the transparent material.

10. The illumination system of claim 1, in which the transparent material comprises a conductive material or a doped semiconductor material, optionally in which the layer of conductive material comprises indium tin oxide (ITO).

11. The illumination system of claim 1, in which the illumination device comprises a laser and/or a vertical cavity surface emitting laser (VCSEL).

12. The illumination system of claim 1, in which the optical element comprises a lens and/or a diffuser.

13. A mobile communications device comprising the illumination system of claim 1.

14. A method comprising:
    operating an illumination device to illuminate an optical element, including illuminating a layer of a transparent material disposed on the optical element; and
    measuring a resistivity of the layer of transparent material by an interlock circuit; and
    controlling operation of the illumination device based on the measured resistivity of the layer of transparent material,
    wherein measuring a resistivity of the layer of transparent material comprises measuring the resistivity of the layer of transparent material synchronously with a modulation frequency of the illumination device, optionally in which measuring the resistivity of the layer of transparent material synchronously with a modulation frequency of the illumination device comprises implementing a lock-in demodulation, and/or wherein controlling operation of the illumination device comprises shutting off the illumination device when the measured resistivity is not synchronous with the modulation frequency of the illumination device.

15. The method of claim 14, in which controlling operation of the illumination device comprises shutting off the illumination device when the measured resistivity does not satisfy a safety criterion, optionally which controlling operation of the illumination device comprises shutting off the illumination device when the measured resistivity falls outside of an allowable range of values.

16. The method of claim 14, comprising measuring a resistivity of a reference layer of the transparent material, the reference layer not being illuminated by the illumination device.

17. The method of claim 16, comprising controlling operation of the illumination device based on a comparison between the measured resistivity of the layer of transparent material and the measured resistivity of the reference layer.

18. The method of claim 16, comprising controlling operation of the illumination device based on the measured resistivity of either the layer of transparent material or the reference layer not satisfying a safety criterion.

* * * * *